United States Patent [19]
Takagi

[11] Patent Number: 5,252,844
[45] Date of Patent: Oct. 12, 1993

[54] SEMICONDUCTOR DEVICE HAVING A REDUNDANT CIRCUIT AND METHOD OF MANUFACTURING THEREOF

[75] Inventor: Hiroshi Takagi, Hyogo, Japan
[73] Assignee: Mitsubishi Denki Kabushiki Kaisha, Tokyo, Japan
[21] Appl. No.: 863,541
[22] Filed: Apr. 6, 1992

Related U.S. Application Data

[63] Continuation of Ser. No. 435,001, Nov. 9, 1989, abandoned.

[30] Foreign Application Priority Data

Nov. 17, 1988 [JP] Japan .................... 63-292975
Nov. 9, 1989 [JP] Japan .................... 1-293217

[51] Int. Cl.⁵ .......................................... H01L 27/02
[52] U.S. Cl. .................... 257/296; 257/379; 257/529; 257/637
[58] Field of Search ............ 357/54, 54 S, 52 C, 357/51, 52; 257/379, 529, 637, 641, 643, 296

[56] References Cited

U.S. PATENT DOCUMENTS

| | | | |
|---|---|---|---|
| 4,413,272 | 11/1983 | Mochizuki et al. | 357/65 |
| 4,618,878 | 10/1986 | Aoyama et al. | 257/643 |
| 4,628,590 | 12/1986 | Udo et al. | 357/51 |
| 4,795,720 | 1/1989 | Kawanabe et al. | 437/52 |
| 4,990,993 | 2/1991 | Tsurumaru | 357/54 |

FOREIGN PATENT DOCUMENTS

| | | | |
|---|---|---|---|
| 0122631 | 4/1984 | European Pat. Off. | |
| 0162145 | 12/1984 | European Pat. Off. | |
| 55-150259 | 11/1980 | Japan | 357/54 S |

OTHER PUBLICATIONS

"Quantitative Measurement with High Time Resolution of Internal Waveforms on MOS RAM's Using a Modified Scanning Electron Microscope", IEEE Journal of Solid-State Circuits, vol. SC-13, No. 3, Jun. 1978.

"Passivation Process for Semiconductor Device with Fusible Link Redundancy", Davis et al., IBM Technical Disclosure Bulletin, vol. 23, No. 10, Mar. 1981.

"Combined Nitride/Polyamide Mask Process", IBM Technical Disclosure Bulletin, vol. 29, No. 12, May 1987.

"Material and Processing Technologies of Polyamide for Advanced Electronic Devices", Endo et al., Solid-State Science and Technology, vol. 136, No. 10, Oct. 1987.

Primary Examiner—Andrew J. James
Assistant Examiner—Courtney A. Bowers
Attorney, Agent, or Firm—Lowe, Price, LeBlanc & Becker

[57] ABSTRACT

A circuit test of a semiconductor device having a redundant circuit for repairing defective circuit is carried with the fuse portion (21) of the redundant circuit and the bonding pad portion (26) exposed and the wiring layers (23) formed on the semiconductor substrate protected with a first protective layer (32). By this step, metal shavings (29) scraped from the surface of the bonding pad by a tester electrode terminal during the circuit test can be prevented from being directly in contact with the interconnection layers, whereby generation of short circuit can be prevented. Thereafter, the surfaces of the bonding pad portion and the fuse portion are covered with a second protective layer (33) and a third protective layer (25) (polyimide). The surface of the bonding pad portion is exposed by etching. By forming the polyimide film on the bonding pad with the second protective layer interposed therebetween, the alkali solution for etching the polyimide film can be prevented from making rough the surface of the bonding pad.

9 Claims, 6 Drawing Sheets

SEMICONDUCTOR DEVICE HAVING A REDUNDANT CIRCUIT AND METHOD OF MANUFACTURING THEREOF

This application is a continuation of application Ser. No. 07/435,001 filed Nov. 9, 1989, now abandoned.

BACKGROUND OF THE INVENTION

1. Field of the Invention

The present invention relates generally to a semiconductor device, in particular to the semiconductor device having a redundant circuit implemented following testing of the device. The present invention also relates a manufacturing method therefor.

2. Description of the Background Art

Generally, in manufacturing a semiconductor device, an integrated circuit is formed on a substrate such as a wafer through a number of processes, the circuit is tested and is packed in a package. A conventional method of manufacturing a semiconductor device including a step of testing circuits will be described in the following with reference to a DRAM (Dynamic Random Access Memory).

First, a structure of the DRAM, especially of a memory cell array will be described. FIG. 3 is a schematic diagram showing a structure of a memory cell array of a conventional DRAM. Referring to FIG. 3, a plurality of word lines WL extending in a row direction and a plurality of bit lines BL extending in a column direction are arranged intersecting with each other in a memory cell array 1. A memory cell MC is provided at each of the intersections of the words lines WL and the bit lines BL. A plurality of row decoders 2 are provided corresponding to the plurality of word lines WL. Each row decoder 2 is connected to a corresponding word line WL through a word driver 3. A plurality of column decoders 4 are provided corresponding to the plurality of bit lines BL.

A spare word line SWL is provided outside of the plurality of word lines WL. A spare memory cell SMC is provided at each of the intersections between the spare word line SWL and the bit lines BL. A spare decoder 5 is provided corresponding to the spare word line SWL. The spare decoder 5 is connected to the spare word line SWL through a spare word driver 6. The spare word line SWL, the spare decoder 5 and the spare word driver 6 constitute a so-called redundant circuit.

The function of the redundant circuit will be described in the following. The redundant circuit is incorporated in a semiconductor device in order to improve production yield of the semiconductor devices. Referring to FIG. 4, description will be given of a characteristic evaluating test of a memory circuit of a DRAM and a method of repairing a defective circuit by using the redundant circuit. First, operating test of the DRAM is carried out by using a tester or the like to detect a defective bit MC1, if any, in the memory cell 1. A fuse FU1 of the word line WL1 including the defective bit MC1 is cut, thereby the defective word line WL1 is separated from the circuit. Thereafter, by cutting the fuse SFU in accordance with a prescribed combination, the circuit is adapted such that the spare line SWL operates only when a signal for selecting the defective bit MC1 is inputted as an external address signal. By connecting a spare line included in the redundant circuit to an original line, a DRAM having a defect can be repaired.

The structure of the DRAM comprising the above described redundant circuit will be described in the following. FIG. 5 schematically shows a cross sectional structure of a memory cell array of the DRAM including the redundant circuit. The memory cell 10 of the DRAM comprises a MOS transistor 11 and a capacitor 12. The MOS transistor 11 comprises source-drain regions 14, 14 formed in a silicon substrate 13 and a gate electrode 16 with a thin gate oxide film 15 interposed therebetween. The capacitor 12 comprises an insulating film 17 formed on the surface of the silicon substrate 13 and an upper electrode 18 deposited on the insulating film 17. The MOS transistor 11 and the capacitor 12 are formed in a region surrounded by a thick field oxide film 34 formed on the surface of the silicon substrate 13. The surface of the MOS transistor 11 or the capacitor 12 is covered with a first interlayer insulating film 19. An internal wiring layer 20 is connected to one side of the source-drain region 14 of the MOS transistor 11 through a contact hole formed in the first interlayer insulating film 19. A fuse portion 21 formed of polysilicon or the like included in the redundant circuit is formed above the field oxide film 34. The shape of the fuse is schematically shown in this figure. A second interlayer insulating film 22 is formed on the surface of the first interlayer insulating film 19. A wiring layer 23 formed of aluminum or the like is formed on the surface of the second interlayer insulating film 22. An end portion of the wiring layer 23 is connected to a bonding pad portion 26 formed of aluminum or the like on a flat peripheral surface of the chip. Essential circuit structure of a semiconductor device is provided by this step of forming the wiring layer 23. Thereafter, a passivation film 24 is formed to cover the entire surface on the surfaces of the wiring layer 23 and the like in order to protect the integrated circuit. A polyimide film 25 formed of a polyimide resin is formed thereon. The polyimide film is employed as an upper most protecting film since it has superior α ray resistance and superior heat resistance.

Main steps of manufacturing a conventional DRAM will be described with reference to FIGS. 6A to 6E. A cross sectional structures shown in FIGS. 6A to 6E schematically show the cross sectional structure of the DRAM shown in FIG. 5 for convenience.

FIG. 6A shows a state in which the wiring layer 23 and the bonding pad portion 26 are formed on the surface of the second interlayer insulating film 22. In this step, the surface of the bonding pad portion 26 is exposed. The circuit is tested in this state. During the circuit test, an electrode terminal 27 of a tester is pressed on the surface of the bonding pad portion 26 to detect defects of the circuit. If a defective portion of the circuit is detected, a fuse 21 provided in the redundant circuit is melted and cut by irradiating a laser beam 28 or a by applying a large current in accordance with one logic. By doing so, a defective circuit can be replaced by a good one. Now, the bonding pad portion 26 is formed of aluminum, which is very soft compared with the electrode terminal 27 which is formed of tungsten (W) or the like. Consequently, it is easily shaved when the electrode terminal 27 is strongly pressed thereon, and shavings 29 of aluminum may be scattered on the upper surface of, for example, the wiring layer 23. Such metal shavings 29 may possibly cause short circuits between the wiring layers 23 in operation. Consequently, the number of defective DRAMs is increased and the production yield of the device is lowered.

Thereafter, as shown in FIG. 6B, a passivation film 24 is formed on the surface on which the wiring layer 23 and the like are formed. Thereafter, a portion on the surface of the bonding pad portion 26 is opened by photolithography and etching using a resist pattern 30a formed on the surface of the passivation film 24 as a mask (FIG. 6C).

As shown in FIG. 6D, the polyimide film 25 is formed on the surface of the bonding pad portion 26 and on the surface of the passivation film 24.

Thereafter, as shown in FIG. 6E, a resist 30b is applied, and the polyimide film 25 on the surface of the bonding pad portion 26 is removed by photolithography and etching. Generally, the polyimide film 25 is dissolved and removed by an alkali solution. However, the alkali solution also dissolves the surface of the bonding pad portion 26 formed of aluminum. Therefore, the surface of the bonding pad 26 becomes rough after the step of patterning the polyimide film 25. The rough surface of the bonding pad 26 causes defective connection of wires for the wire bonding when it is packed in a package.

As described above, the conventional manufacturing method exhibits the following draw backs, namely, (a) metal shavings of the bonding pad portion 26 caused by the contact during the circuit test caused short circuits between wiring layers; and (b) the surface of the bonding pad portion 26 is made rough by the alkali solution in the step of patterning the polyimide film 25 formed directly above the surface of the bonding pad portion 26.

With regard to the above described point (a), the surfaces of the metal shavings scattered between the interconnection layers are naturally oxidized in the stage of testing the wafer, so that they are not the cause of the defects. However, at the consumer test or a final test after a burn-in test during which a high voltage is applied at a high temperature, the surfaces of the metal shavings are activated, causing defects such as short circuits. Therefore, the generation of metal shavings was a serial problem.

SUMMARY OF THE INVENTION

An object of the present invention is to improve the semiconductor device that is not damaged during the testing.

Another object of the present invention is to provide the semiconductor device having a high production yield.

Another object of the present invention is to improve production yield of semiconductor devices during processes of manufacturing semiconductor devices including a step of testing circuit.

A further object of the present invention is to provide a method of manufacturing semiconductor devices capable of preventing short circuits between interconnections derived from the circuit test.

A further object of the present invention is to provide a method of manufacturing semiconductor devices capable of preventing defective interconnections derived from rough surfaces of bonding pad portions of the semiconductor devices.

The semiconductor device of the present invention comprises an integrated circuit and a redundancy circuit for the compensation thereof. The surface of the circuit is covered with first and second protective layers. An opening portion is positioned formed in the first and second protective layers on the surface of a test pad. The surface of a fuse element included in the redundancy circuit is covered with the second protective layer formed in the opening portion of the first protective layer.

In accordance with the method of manufacturing the semiconductor device of the present invention, at first only the bonding pad portion and the fuse portion of the redundant circuit on the semiconductor substrate are exposed, and the circuit test is carried with other regions covered by a productive film. Accordingly, metal shavings generated when the electrode terminal of a tester for testing the circuit is pressed on the bonding pad portion are scattered on the protective film. Consequently, the metal shavings do not cause any short circuit between wiring layers.

The uppermost protective film such as the polyimide film is formed on the bonding pad portion with the second protective film interposed therebetween. The step of exposing the surface of the bonding pad portion is carried out by removing the uppermost protective film and the second protective film by using the same resist pattern. Consequently, the second protective film prevents the alkali solution employed for removing the uppermost protective film, such as the polyimide film, from making rough the surface of the pad portion. In addition, the uppermost protective film and the second protective film can be both patterned by the same patterning process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be described in detail with reference to the figures.

Figure 1:
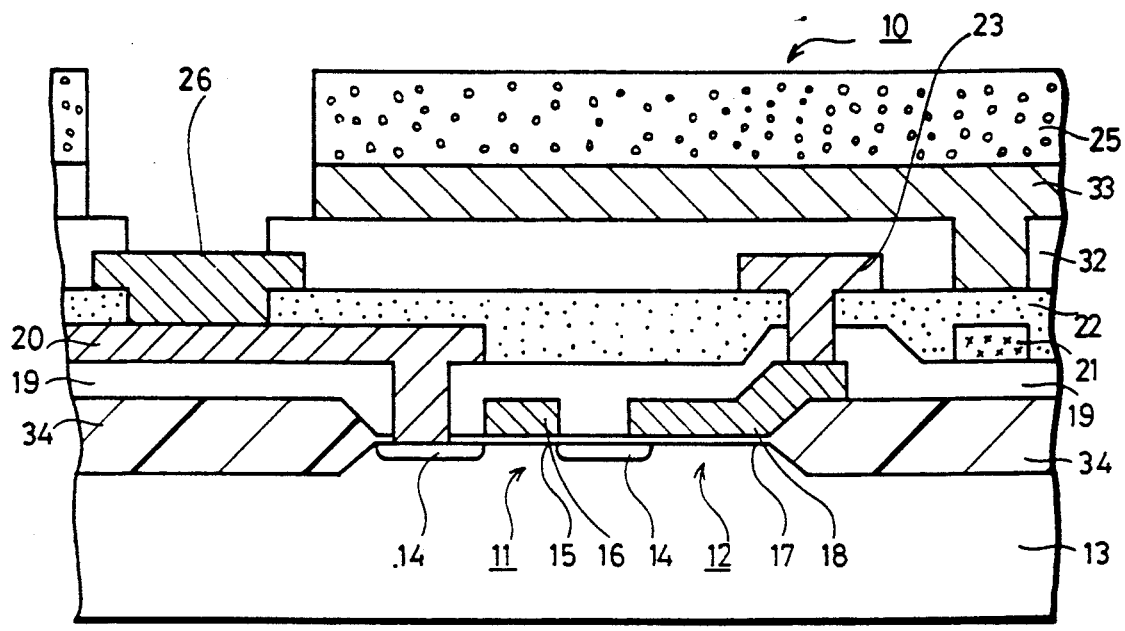
FIG. 1 is a cross sectional view showing a cross sectional structure of a memory cell of a DRAM manufactured in accordance with one embodiment of the present invention.
Figure 5:
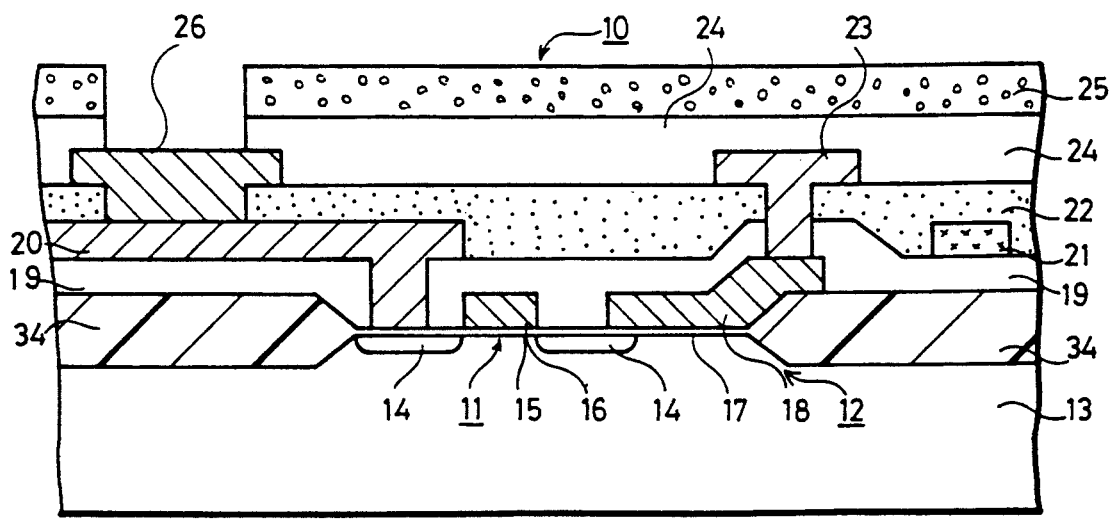
FIG. 5 is a cross sectional view showing a cross sectional structure of a memory cell of a conventional DRAM.
Figure 6A:
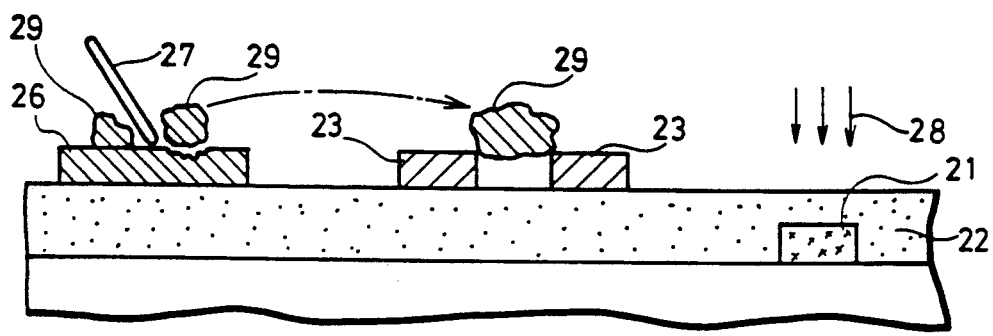
FIGS. 6A, 6B, 6C, 6D and 6E are cross sectional views showing, in this order, processes of manufacturing the memory cell of the conventional DRAM shown in FIG. 5.
Figure 6B:
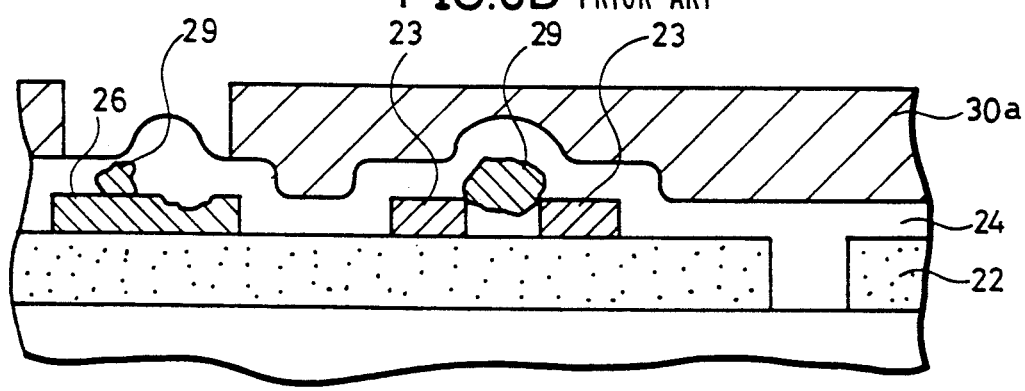
Figure 6C:
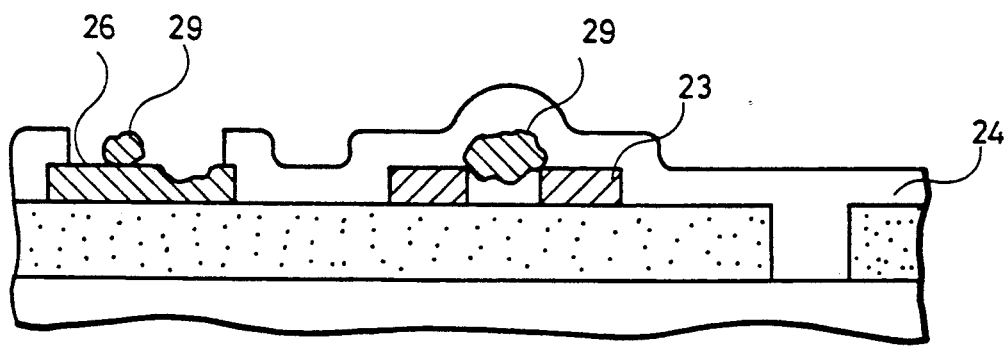
Figure 6D:
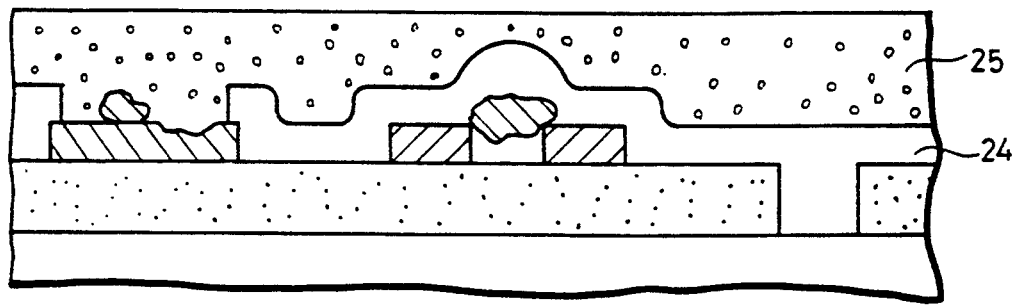
Figure 6E:
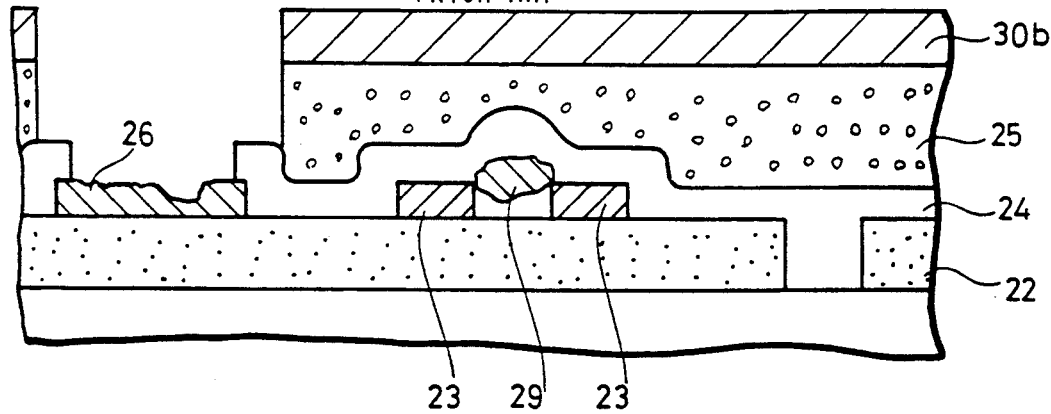

FIG. 1 shows a cross sectional structure of a memory cell of a DRAM in accordance with one embodiment of the present invention. Referring to FIG. 1, the memory cell 10 of the DRAM comprises a MOS transistor 11 and a capacitor 12. The MOS transistor 11 comprises source-drain regions 14, 14 formed in a silicon substrate 13 and a gate electrode 16 with a thin gate oxide film 15 interposed therebetween. The capacitor 12 comprises an insulating film 17 formed on the surface of the silicon substrate 13 and an upper electrode 18 deposited on the insulating film 17. The MOS transistor 11 and the capacitor 12 are formed in a region surrounded by a thick field oxide film 34 formed on the surface of the silicon substrate 13. The surface of the MOS transistor 11 or the capacitor 12 is covered with a first interlayer insulating film 19. An internal wiring layer 20 is connected to one side of the source-drain region 14 of the MOS transistor 11 through a contact hole formed in the first interlayer insulating film 19. A fuse portion 21 formed of polysilicon or the like included in the redundant circuit is formed above the field oxide film 34. The shape of the fuse is schematically shown in this figure. A second interlayer insulating film 22 is formed on the surface of the first interlayer insulating film 19. A wiring layer 23 formed of aluminum or the like is formed on the surface of the second interlayer insulating film 22. An end portion of the wiring layer 23 is connected to a bonding pad portion 26 formed of aluminum or the like on a flat peripheral surface of the chip. Compared with the cross sectional structure of a conventional DRAM shown FIG. 5 which corresponds to FIG. 1, the structure of this embodiment is characterized in that the protective films formed on the surface of the wiring layer 23 or the like has a three-layer structure. The first and second protective films 32, 33 are formed of silicon oxide or silicon nitride and the protective film 25 formed as the uppermost layer is a polyimide film.

Main process steps for manufacturing the DRAM including the step of testing the circuit in accordance with the present embodiment will be described. In the figures referred to in the following, the interconnection portions and the protective layers of the DRAM are schematically shown for convenience of description, so that they do not exactly correspond to the cross sectional structure of the DRAM shown in FIG. 1. FIGS. 2A to 2F are cross sectional views showing in this order the steps of manufacturing the DRAM in accordance with the present invention.

Figure 2A:
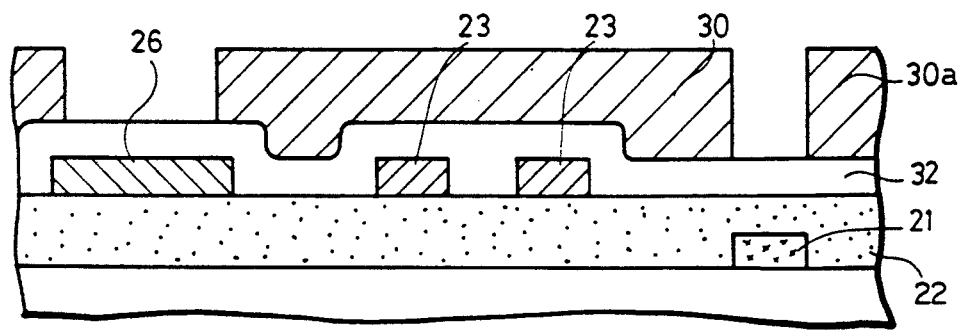
FIGS. 2A, 2B, 2C, 2D, 2E and 2F are schematic cross sectional views showing, in this order, processes of manufacturing the memory cell of the DRAM shown in FIG. 1.

As shown in FIG. 2A, semiconductor elements such as a transistor and a capacitor constituting the DRAM have been formed on the semiconductor substrate in the preceding step. In the figure, the wiring layer 23, the bonding pad portion 26 and the fuse portion 21 included in the redundant circuit are schematically shown. The fuse portion 21 constituting the redundant circuit is formed of a material such as metal silicide or metal polycide. The wiring layer 23 and the bonding pad portion 26 are formed of aluminum or the like. The wiring layer 23, the bonding pad portion 26 and the like are formed on the interlayer insulating film 22. A first protective film 32 formed of a silicon oxide film or a silicon nitride film is formed to cover the surfaces of the wiring layer 23 and the bonding pad portion 26. The thickness of the first protective film 32 may be 0.3 μm to 5.0 μm and preferably it is about 0.5 μm to 1.0 μm. A resist 30a is applied to the surface of the first protective film 32 and it is patterned to have a prescribed pattern.

Figure 2B:
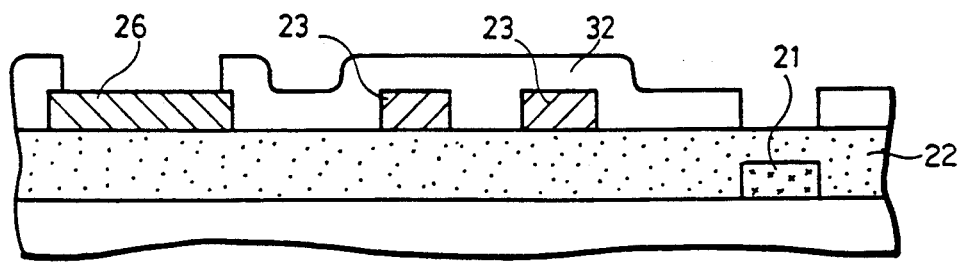

Thereafter, as shown in FIG. 2B, the first protective film 32 is patterned using the patterned resist 30a as a mask. In this step, the surface of the bonding pad portion 26 and the surface of the interlayer insulating film 22 positioned on the fuse portion 21 are exposed. The first protective film 32 is etched by plasma etching or wet etching. Thereafter, the resist 30a is removed.

Figure 2C:
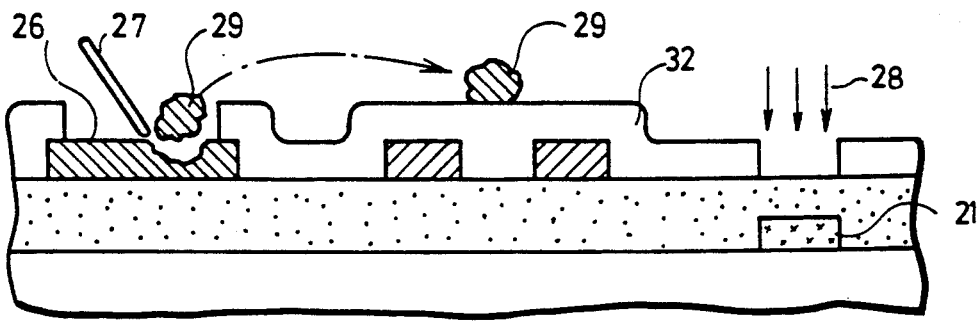

As shown in FIG. 2C, the circuit is tested by using the exposed surface of the bonding pad portion 26. The circuit test is carried out by pressing the electrode terminal 27 of a tester onto the surface of the bonding pad portion 26. The electrode terminal 27 formed of titanium or tungsten is harder than the bonding pad portion 26 which is formed of aluminum. Consequently, when the electrode terminal 27 presses the surface of the bonding pad portion 26, the surface is scraped and metal shaving 29 of aluminum scatter on the surface of the first protective film 32. When a defective portion is detected in the circuit test, the fuse portion 21 provided in the redundant circuit is melted and cut by irradiating a laser beam or by applying a large current in accordance with a prescribed logic. In the figure, a state of irradiation of a laser beam 28 is schematically shown.

Figure 2D:
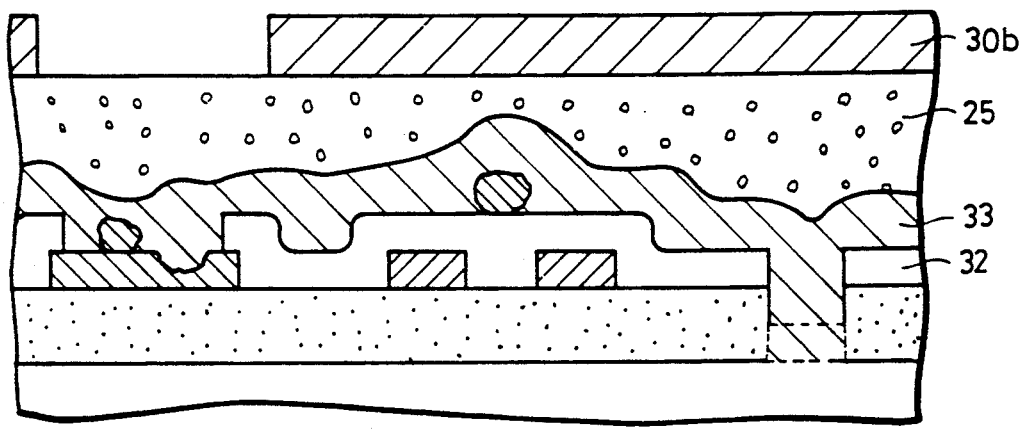

After the defective portion is repaired by using the redundant circuit, a second protective film 33 formed of a silicon oxide film or a silicon nitride film is formed on the entire surface including the exposed surface of the fuse portion 21 and the surface of the bonding pad portion 26, as shown in FIG. 2D. As is apparent from drawing FIG. 2D, the second protective film 33 thus fills the opening formed in the first protective film 32 to expose the bonding pad portion 26. The thickness of the second protective film 33 may be 0.1 μm to 3 μm and it is preferably about 0.1 μm to 0.5 μm. Further, the polyimide film 25 is formed on the upper surface of the second protective film 33. The resist 30b is applied to the surface of the polyimide film 25 and it is patterned to have a prescribed pattern by photolithography.

Figure 2E:
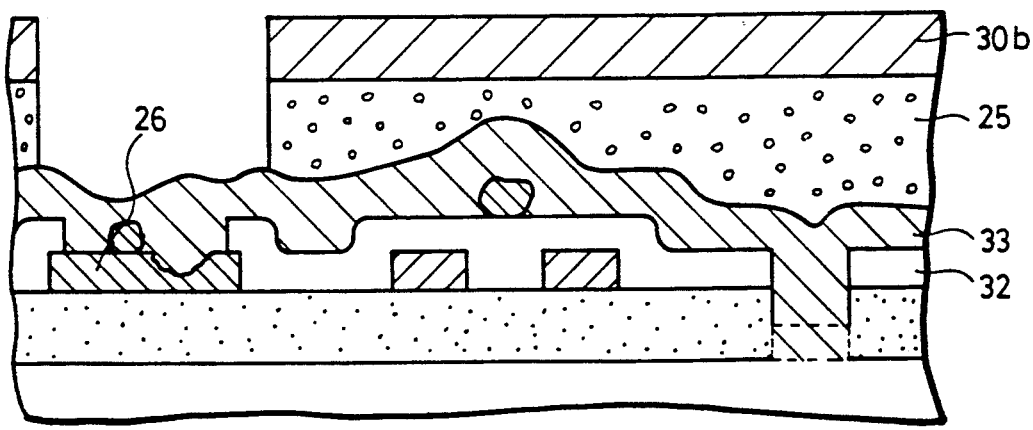

Thereafter, as shown in FIG. 2E, a prescribed portion of the polyimide film 25 is removed by an alkali solution using the patterned resist 30b as a mask. Since the surface of the bonding pad portion 26 is completely covered by the second protective film 33 in this step, it is not exposed to the alkali solution for removing the polyimide film 25. Therefore, unlike the conventional method, the surface of the bonding pad portion is not made rough in this step of removing the polyimide film 25.

Figure 2F:
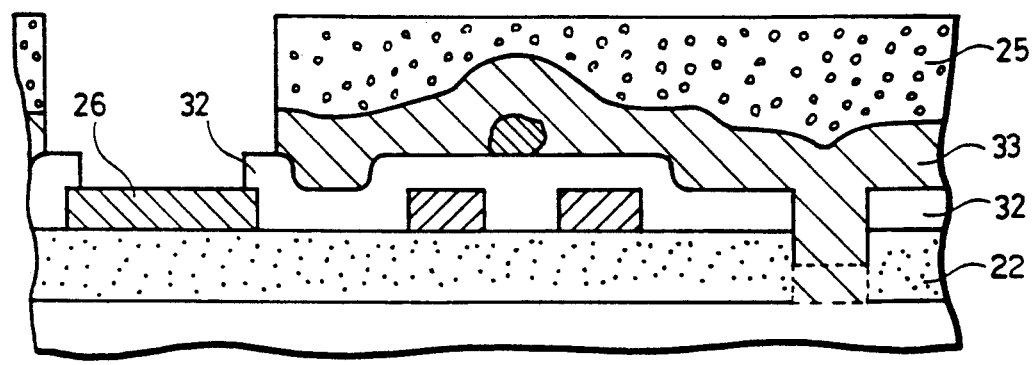
Figure 3:
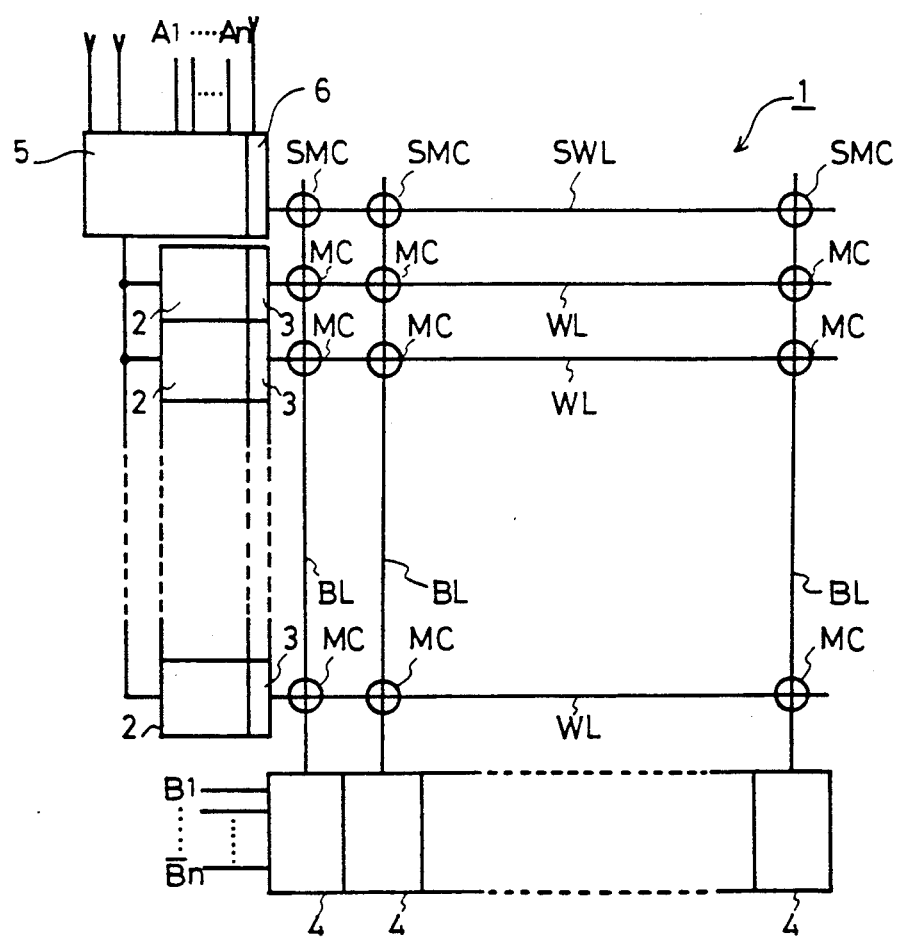
FIG. 3 is a block diagram showing a memory cell array including a redundant circuit and peripheral portions thereof in a common DRAM.
Figure 4:
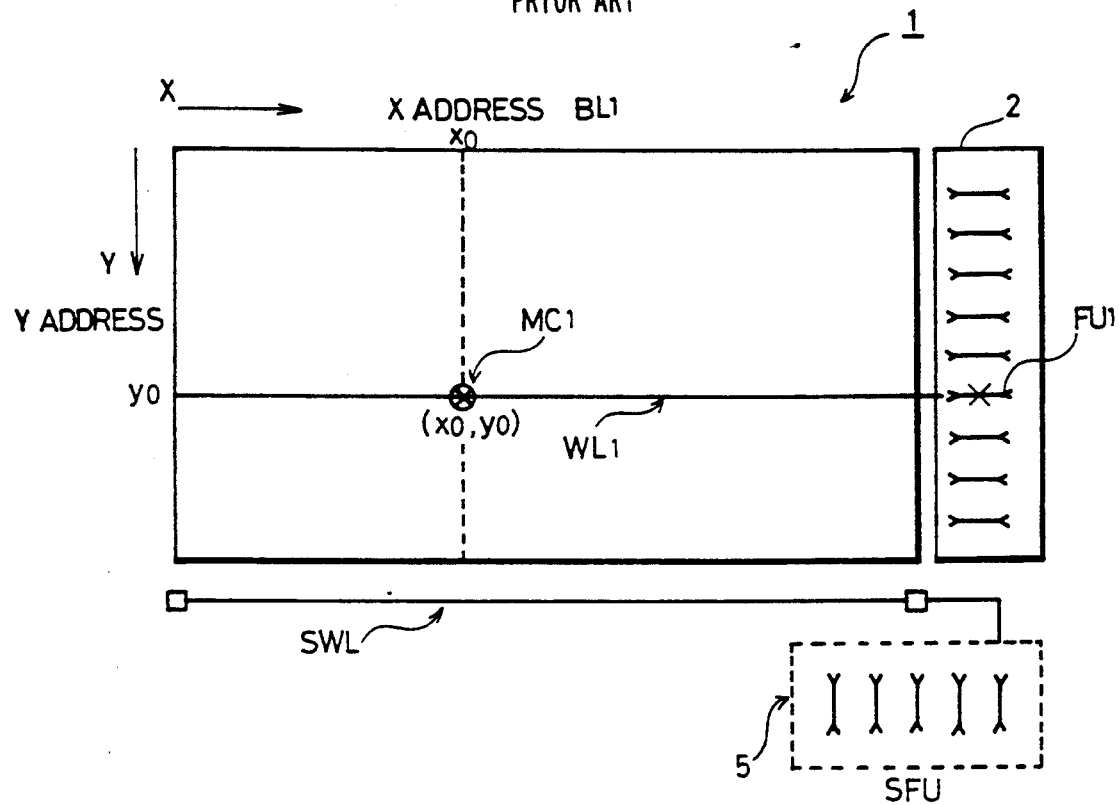
FIG. 4 shows an idea of the redundant circuit.

As shown in FIG. 2F, the second protective film 33 is selectively removed by using the same resist pattern 30b as a mask. The second protective film 33 may be removed after the removal of the resist pattern 30b, by using the polyimide film 25 as a mask. The surface of the bonding pad portion 26 is exposed by this step. If the first protective film 32 and the second protective film 33 are formed of different materials, the end point of etching can be detected at the final stage of etching the second protective film 33, as the etching rate changes at the interface between the layers formed of different materials. Through the above described steps, a semiconductor chip of a DRAM having a polyimide film as the uppermost protective film can be manufactured.

The semiconductor device is finished after the successive step of packaging.

As described above, according to the present invention, main wiring regions other than the fuse portion of the redundant circuit and a bonding pad portion are covered by a protective film so that metal shavings generated during the circuit test do not scatter on the main regions. Consequently, short circuits caused by the metal shavings can be prevented. In the step of exposing the surface of the bonding pad portion after the formation of the polyimide film as the uppermost protective film, the second protective film is formed on the surface of the bonding pad portion, so that the influence of the step of selectively removing the polyimide film does not damage the surface of the bonding pad portion. Consequently, the surface of the bonding pad portion can be kept smooth and is not made rough. By the provision of these two steps, the generation of defects derived from short circuits of the semiconductor device or the generation of defects caused by defective interconnections derived from rough surface of the bonding pad portion can be prevented, thereby improving production yield of the semiconductor devices.

Since the method of manufacturing a memory cell of a DRAM has been described in the foregoing, the application of the manufacturing method is not limited and the method of the present invention can be widely applied to semiconductor devices suffering from the same problems.

As described above, according to the present invention, the circuit test for detecting a defective portion in a defective chip of a semiconductor device is carried out after the formation of the first protective film, so that the short circuits between interconnections caused by metal shavings can be completely prevented. In addition, the second protective film is formed on the surface of the bonding pad portion and the polyimide film is formed thereon, and the polyimide film and the second protective film are selectively removed in this order. Consequently, metal corrosion of the bonding pad portion which was caused in removing the polyimide film can be prevented. Causes of short circuits between interconnections or causes of defective interconnections during manufacturing can be prevented, so that highly reliable semiconductor devices can be manufactured with superior production yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a redundant circuit, comprising:
   a semiconductor substrate (13);
   a first insulating layer (19) formed on said substrate;
   a second insulating layer (22) formed over said substrate;
   a wiring layer (23) formed on said second insulating layer;
   a first protective layer (32) formed on said second insulating layer and overlying said wiring layer;
   a second protective layer (33) formed on said first protective layer;
   a transistor including a gate electrode and a plurality of source/drain regions in a surface of the substrate;
   a capacitor structure including an upper electrode separated by a thin insulating film from one source/drain region;
   said first insulating layer separating said upper electrode from said gate electrode;
   an internal wiring layer (20) formed on said first insulating layer and contacting a second source/drain region;
   said first insulating layer separating said internal wiring layer from said gate electrode;
   a test pad (26) formed on said second insulating layer, said first and second protective layers having respective offset openings therethrough for exposing said test pad;
   said first and second protective layers having a stepped offset configuration over said test pad and preventing said second protective layer from contacting said test pad; and
   a fuse element (21) formed on said first insulating layer (19), said second protective layer extending through an opening formed in said first protective layer above said fuse element.

2. A semiconductor device according to claim 1, further comprising
   a third protective layer (25) formed on said second protective layer (33).

3. A semiconductor device including a redundant circuit, comprising:
   a semiconductor substrate (13);
   a transistor including a source/drain region in a major surface of said substrate and a gate electrode over a channel adjacent the source/drain region;
   a first insulating layer (19) formed on said substrate;
   a second insulating layer (22) formed on said first insulating layer;
   an internal wiring layer (20) formed on said first insulating layer and contacting said source/drain region;
   said first insulating layer separating said internal wiring layer from said gate electrode;
   a second wiring layer (23) formed on said second insulating layer;
   a first protective layer (32) formed on said second insulating layer and overlying said second wiring layer;
   a second protective layer (33) formed on said first protective layer;
   a test pad (26) formed on said second insulating layer, said test pad connected to said second wiring layer, said first and second protective layers having respective offset openings therethrough for exposing said test pad;
   said first and second protective layers having a stepped offset configuration over said test pad and preventing said second protective layer from contacting said test pad; and
   a fuse element (21) formed on said first insulating layer, said second protective layer extending through an opening formed in said first protective layer above said fuse element.

4. A semiconductor device including a redundant circuit, comprising:
   a semiconductor substrate (13);
   a first insulating layer (19) formed on said substrate;
   a transistor including a gate electrode and a source/drain region in a surface of the substrate;
   a capacitor structure including an upper electrode separated by a thin insulating film from said source/drain region;
   said first insulating layer separating said upper electrode from said gate electrode;
   a second insulating layer (22) formed on said first insulating layer;
   a wiring layer (23) formed on said second insulating layer;
   a first protective layer (32) formed on said second insulating layer and overlying said wiring layer;
   a second protective layer (33) formed on said first protective layer;

a test pad (26) formed on said second insulating layer, said first and second protective layers having respective offset openings therethrough for exposing said test pad;
said first and second protective layers having a stepped offset configuration over said test pad and preventing said second protective layer from contacting said test pad; and
a fuse element (21) formed on said first insulating layer, said second protective layer extending through an opening formed in said first protective layer above said fuse element.

5. A semiconductor device according to claim 1, wherein said second insulating layer (22) covers an entire surface of said fuse element opposite to said major surface of said substrate thereby separating said first protective layer (32) from said fuse element.

6. A semiconductor device according to claim 1, wherein said opening in said first protective layer (32) is disposed above an entire surface of said fuse element, thereby preventing said first protective layer from contacting said fuse element.

7. A semiconductor device according to claim 6, wherein said first protective layer contacts said test pad and said opening therein above the entire surface of said fuse element prevents said first protective layer from contacting said fuse element.

8. A semiconductor device according to claim 3, wherein said second insulating layer (22) covers an entire surface of said fuse element opposite to said major surface of said substrate thereby separating said first protective layer (32) from said fuse element,
wherein said first protective layer (32) contacts said test pad, and
wherein said opening in said first protective layer (32) is disposed above an entire surface of said fuse element, thereby preventing said first protective layer from contacting said fuse element.

9. A semiconductor device according to claim 4, wherein said second insulating layer (22) covers an entire surface of said fuse element opposite to said major surface of said substrate thereby separating said first protective layer (32) from said fuse element,
wherein said first protective layer (32) contacts said test pad, and
wherein said opening in said first protective layer (32) is disposed above an entire surface of said fuse element, thereby preventing said first protective layer from contacting said fuse element.

* * * * *